(12) United States Patent
Chang (10) Patent No.: US 7,372,169 B2
(45) Date of Patent: May 13, 2008

(54) ARRANGEMENT OF CONDUCTIVE PADS ON GRID ARRAY PACKAGE AND ON CIRCUIT BOARD

(75) Inventor: Wen-Yuan Chang, Taipei (TW)

(73) Assignee: VIA Technologies, Inc., Tapei (TW)

( * ) Notice: Subject to any disclaimer, the term of this patent is extended or adjusted under 35 U.S.C. 154(b) by 213 days.

(21) Appl. No.: 11/246,281

(22) Filed: Oct. 11, 2005

(65) Prior Publication Data

US 2007/0080456 A1 Apr. 12, 2007

(51) Int. Cl.
*H01L 23/48* (2006.01)
(52) U.S. Cl. ...................... 257/786; 257/738; 257/693; 257/697; 257/E23.015; 257/E23.069
(58) Field of Classification Search ................ 257/693, 257/786, E23.069, 697, 772, 779, 737, 738, 257/E23.015, E23.02, E23.023–E23.079, 257/E23.021, E21.508
See application file for complete search history.

(56) References Cited

U.S. PATENT DOCUMENTS

| | | | | |
|---|---|---|---|---|
| 5,729,894 A | * | 3/1998 | Rostoker et al. | ............... 29/832 |
| 2002/0070438 A1 | * | 6/2002 | Ference et al. | ............. 257/685 |

* cited by examiner

*Primary Examiner*—Jasmine Clark
(74) *Attorney, Agent, or Firm*—Birch, Stewart, Kolasch & Birch, LLP (57) ABSTRACT

The present invention discloses a dense arrangement in the conductors of a package and the corresponding conductive pads of a circuit board. The conductors and the corresponding conductive pads are separated into at least a first group in a peripheral region of the grid array package, and a second group in another region of the grid array package. Most in the first group of conductive pads are apart at a first pitch, most in the second group of conductive pads are apart at a second pitch which is less than the first pitch. According to the shrinking in the conductive trace on a conductive layer and the shrinking in the through hole, the first pitch and the second pitch are optimized for the maximum conductors and the corresponding conductive pads.

18 Claims, 6 Drawing Sheets

ARRANGEMENT OF CONDUCTIVE PADS ON GRID ARRAY PACKAGE AND ON CIRCUIT BOARD

BACKGROUND OF THE INVENTION

1. Field of Invention

The present invention relates to the arrangement of conductive pads on a package and the corresponding pads on a circuit board, especially to the arrangement of conductive pads on a grid array package and the corresponding pads on a circuit board.

2. Related Art

Figure 1A:
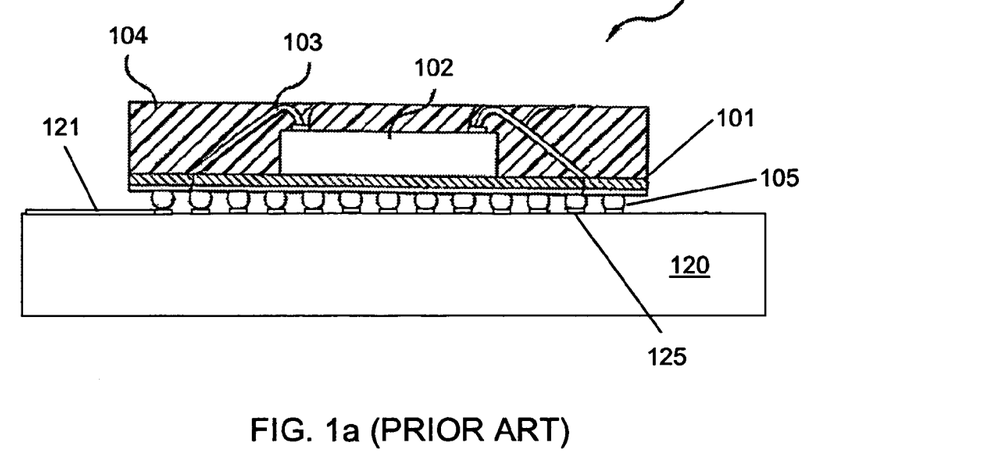
FIG. 1a shows a cross-sectional view of a conventional grid array package.

Typically, semiconductor chip is disposed on a package to electrically connect with a circuit board. The package provides the well protections against the chemistry, moisture, static-electric damage and other damages to prolong the lifetime of the chip. One common type of the packages is a ball grid array (BGA) package. A conventional grid array package 100 has a substrate 101, a chip 102 disposed on the substrate 101, a plurality of conductive wires 103 and a molding material 104. As shown in FIG. 1a, the package 100 is for example a BGA package using wire-bonding technology. The substrate 101 and the chip 102 are electrically connected through the conductive wires 103, and then the molding material 104 encapsulates the chip 102 and the conductive wires 103 for the well-protections. The package 100 further has a plurality of solder balls 105 disposed on a surface of the substrate 101 for the electrical connections with a circuit board 120.

Figure 1B:
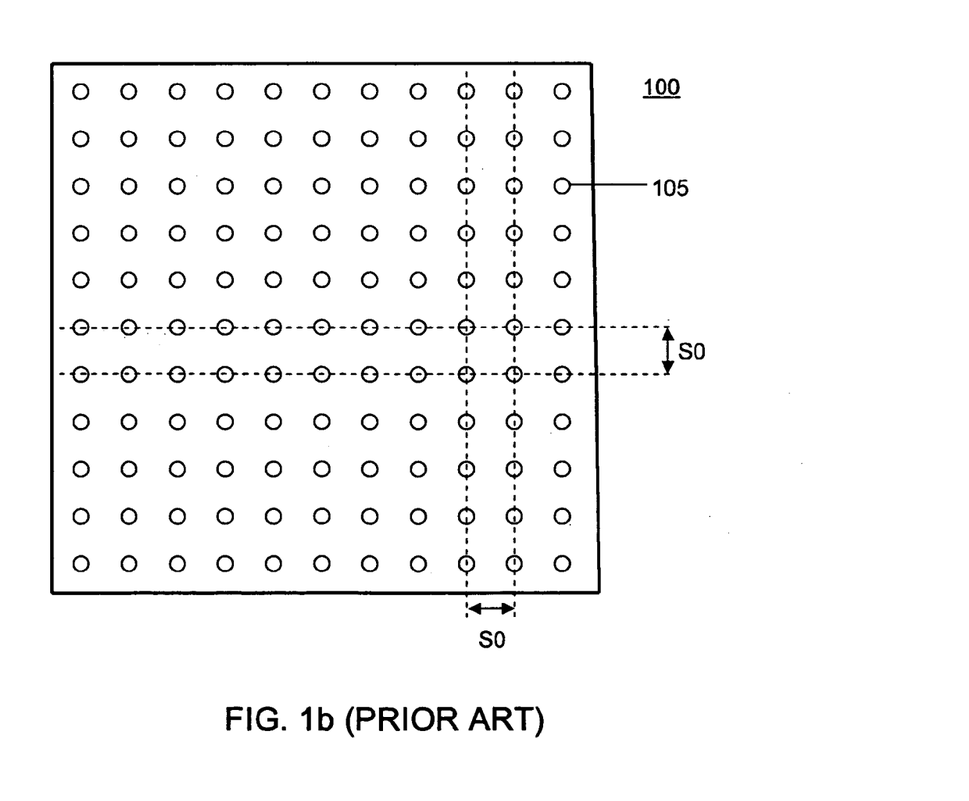
FIG. 1b shows a bottom view of the conventional grid array package and an arrangement of conductive pads on the package.

Referring to FIG. 1b, the solder balls 105 are regularly disposed in rows and columns. One row of the solder balls 105 is apart from the adjacent row of the solder balls 105 at a pitch S0. Similarly, one column of the solder balls is apart from the adjacent column at the same pitch S0. Thus, the solder balls 105 disposed in the rows and columns are like a ball grid array on the bottom surface of the package 100. There are a plurality of virtual grids in the crossings of the rows and the columns, and the solder balls 105 are disposed on the virtual grids. The solders balls 105 are disposed in the pitch S0.

The grid array packages similar to the BGA package include, for example pin grid array (PGA) package and land grid array (LGA) package. Although these electrical connections between the package 100 and the circuit board 120 are different, all of the electrical connections are arranged in an array of rows and columns. Therefore, the solder balls 105 disposed on the package 100 and the conductive pads 125 disposed on the circuit board 120 are populated at the crossings of the rows and columns. However, BGA packages are widely used in current IC packaging industry because of the advantages of BGA packages, such as high reliability, good thermal and electrical performance, and mature manufacture process.

Figure 1C:
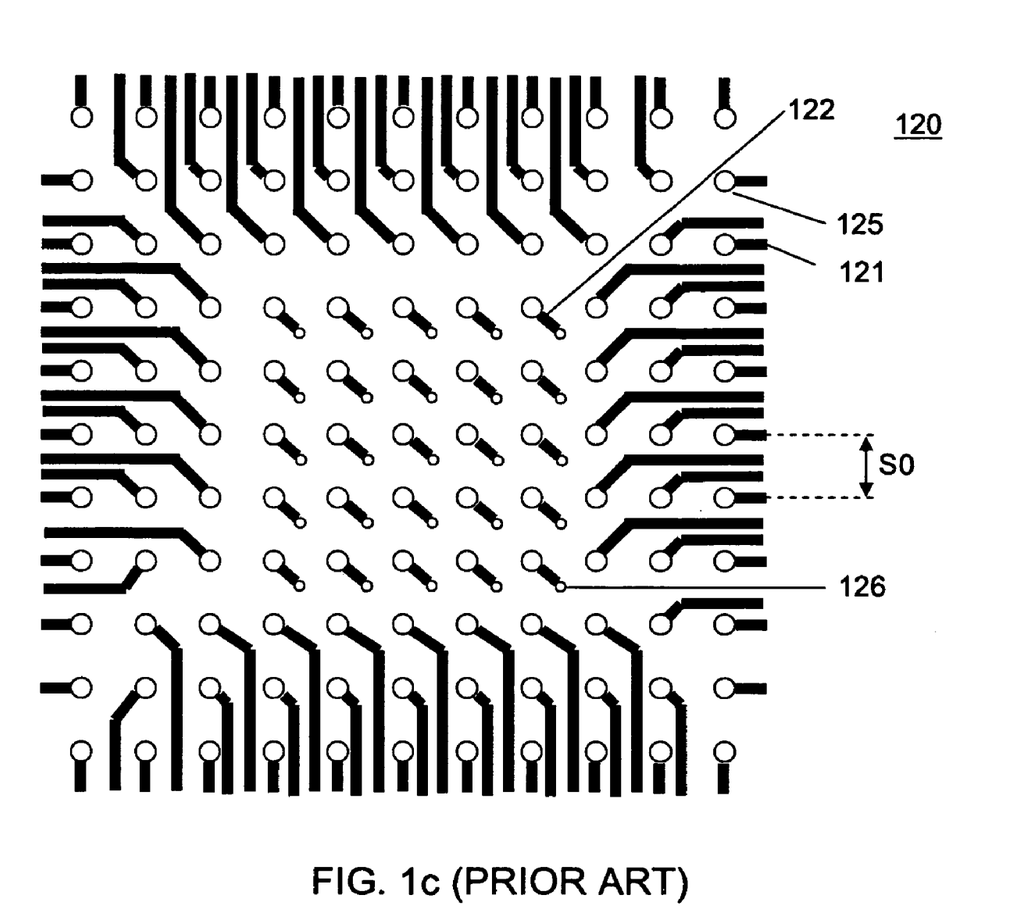
FIG. 1c shows a top view of a conventional circuit board and an arrangement of conductive pads on the circuit board.

The solder balls 105 of the BGA package are used as the electric contacts with a circuit board 120. More particularly, one solder ball 105 is in contact with one conductive pad 125 disposed on the circuit board 120. In the other words, the arrangement of the solder balls 105 is the one-on-one mapping of the arrangement of the conductive pads 125. FIG. 1c shows the conventional arrangement of the conductive pads 125 on the circuit board 120 to connect with the grid array package 100. A plurality of conductive pads 125 respectively corresponding to the solder balls 105 of the package 100 dispose on a surface of the circuit board 120. Furthermore, the conductive pads 125 are electrically connected to other components disposed in the circuit board 120, such as the power/ground plane, the decoupling capacitor or other devices. Each conductive pad 125 disposed in the peripheral region is connected with a conductive trace 121 on the surface of the circuit board 120. The conductive trace 121 is extending toward the outer region on the circuit board 120 which is not under the package 100. Because of the limitation in the pitch S0 of two adjacent conductive pads 125, one conductive pad 125 disposed in the inner region of the conductive pads are electrically connected to the internal circuit of the circuit board 120 via a conductive trace 122 and a through hole 126 nearby.

The grid array package provides a high amount of contacts for the package and the circuit board comparing with the other package, such as the Quad Flat No-Lead (QFN) Package. As more functions are being integrated in the semiconductor chip, it is necessary to provide more contacts between the package and the circuit board. However, the available surface on a chip is shrunk as the development of the manufacturing process and the thirst for high performance. The arrangement of the conductive pads and the traces routing are more and more complex and difficult. It is thus imperative to provide a denser contacts in the same dimension for the grid array package is a serious challenge for the designers of circuit board and package.

SUMMARY OF THE INVENTION

In view of the foregoing, the present invention is to provide a dense arrangement on the contacts between the package and the circuit board for optimizing the pitch in accordance with the dimension of the conductive trace and the dimension of the through hole.

To achieve the above aspects, a chip according to the present invention provides a conductive pads arrangement for a grid array package suitable to electrically connect to a circuit board. The conductive pads disposed on a surface of the grid array package includes a plurality of first conductive pads disposed in a peripheral region of the surface and a plurality of second conductive pads disposed in an inner region of the surface. Most of the first conductive pads are disposed in a first pitch, most of the second conductive pads are disposed in a second pitch, and the first pitch is larger than the second pitch.

The present invention also provides a conductive pads arrangement in a circuit board, suitable to electrically connect to a grid array package. The conductive pads disposed on a surface of the circuit board include a plurality of first conductive pads in a peripheral region of the surface, and a plurality of second conductive pads in an inner region of the surface. Most of the first conductive pads are disposed in a first pitch, most of the second conductive pads are disposed in a second pitch, and the first pitch is larger than the second pitch.

The present invention also provides a grid array package, suitable to electrically connect to a circuit board. The grid array package includes a substrate having a first surface and a second surface, a chip disposed on the second surface, a plurality of first conductive pads, and a plurality of second conductive pads. The first conductive pads are disposed in a first region on the first surface of the grid array package, wherein the first conductive pads are arranged in a first grid array of rows and columns and the rows and columns are arranged in a first pitch. The second conductive pads are disposed in a second region on the first surface of the grid array package, wherein the second conductive pads are arranged in a second grid array of rows and columns arranged in a second pitch, and the first pitch is larger than the second pitch.

In the aforementioned grid array package, the first region is adjacent to at least an edge of the package.

In the aforementioned grid array package, the two adjacent first conductive pads disposed in the first pitch form a space between two adjacent conductive pads on the circuit board to allow at least one conductive trace on the circuit board passing through. The adjacent second conductive pads disposed in the second pitch form a space to dispose at least one through hole. The objective of the present invention is achieved by optimizing the first pitch and the second pitch according to the dimension of the conductive trace and the dimension of the through hole.

BRIEF DESCRIPTION OF THE DRAWINGS

Other aspects, feathers and advantages of the present invention will become apparent form the following detailed description, taken in conjunction with the accompanying drawing wherein like elements are given like reference numerals throughout.

DETAILED DESCRIPTION OF THE INVENTION

The present invention provides an arrangement for the conductors of a grid array package and the corresponding pads of a circuit board.

Figure 2A:
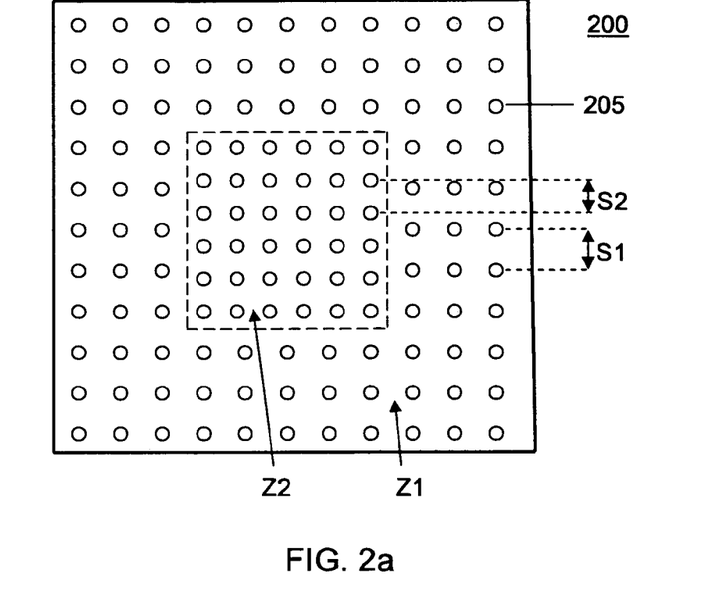
FIG. 2a shows a bottom view of an arrangement of conductive pads on a grid array package according to a first embodiment of the present invention.
Figure 2B:
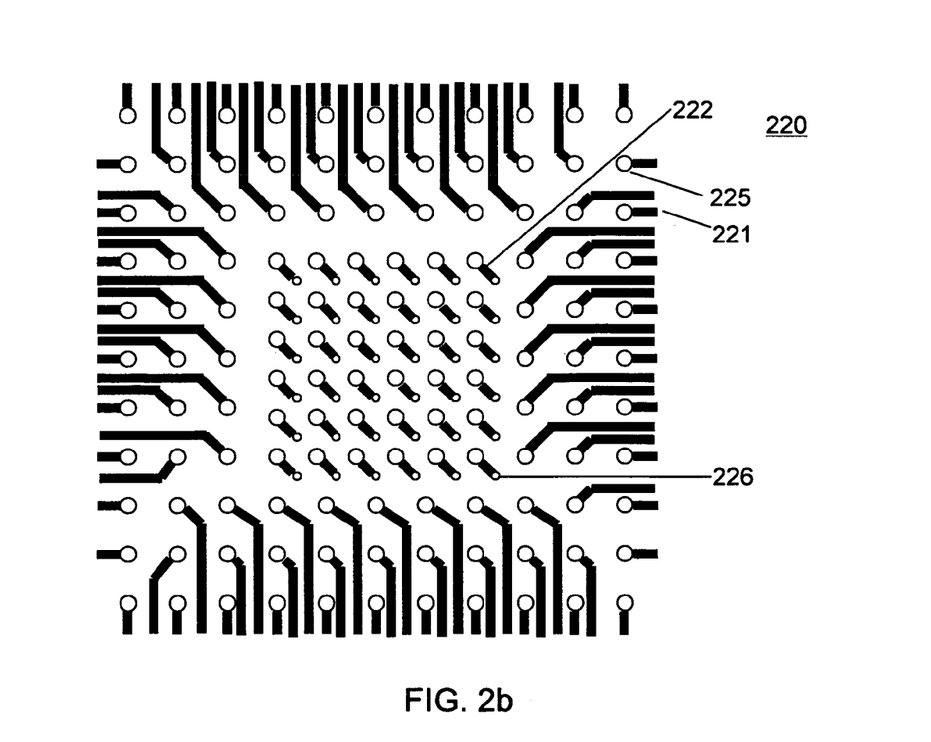
FIG. 2b shows a top view of an arrangement of conductive pads on a circuit board according to the first embodiment of the present invention.

A first embodiment of an arrangement of conductive pads on a grid array package and on a circuit board according to the present invention are shown in FIGS. 2a and 2b. FIG. 2a shows the bottom view of a grid array package 200 and FIG. 2b shows the top view of a circuit board 220 suitable to connect with the package 200. The grid array package 200 includes a plurality of conductors 205 disposed on the bottom surface of the package 200. The conductors 205 may be solder balls, contact pins, contact landings or conductive pads on the surface of the package 200.

In this embodiment, the conductors 205 are divided into two groups. The first group of conductors is disposed in a peripheral region Z1, and the second group of conductors is disposed in an inner region Z2 which is surrounded by the first group of conductors. The first group of conductors is arranged in a first grid array of rows and columns. The rows and columns of the first grid array on the surface of the package 200 are arranged in a first pitch S1. There are a plurality of virtual grids in the crossings of the rows and the columns, and one conductor 205 is distinctly disposed on one of the virtual grids. In other words, one conductor in the first group of conductors is regularly disposed in the first pitch S1. Similarly, the second group of conductors are also arranged in a second grid array of rows and columns, and one of the second group of conductors are regularly disposed in the second pitch S2.

Each of the conductors 205 of the package 200 is electrically connected to a corresponding pad on the circuit board 220. Referring to FIG. 2b, a plurality of conductive pads 225, a plurality of conductive trace 221 and 222, and a plurality of conductive through holes 226 coupled to the through hole are disposed on a surface of the circuit board 220. One of the conductive pads 225 in the projection region of the peripheral region Z1 of the package 200 is connected to other device through a conductive trace 221 extending toward the edge of the package 200 and the outer space. The conductive pads 225 in the projection region of the inner region Z2 of the package 200 are respectively coupled to the other components through a conductive trace 222, a through hole 226 and an internal circuit of the circuit board 220.

The space between two adjacent conductive pads 225 in first pitch S1 allows at least one conductive trace 221 passing through. The larger first pitch S1, the more conductive traces 221 pass through the space. However, the amount of conductive pads in the same area is decreased and can't meet the needs of higher performance products. In this embodiment, the first group of conductive pads in the peripheral region Z1 is regularly disposed in the first pitch S1 which allows one or two conductive trace 221 passing through. The second group of conductive pads in the inner region Z2 is regularly disposed in the second pitch S2. The through hole 226 are disposed in the space between the adjacent conductive pads in the second group. Thus, the second pitch S2 may be shortened as the shrinking in the dimension of the through-hole 226. The first pitch S1 is larger than the second pitch S2 to provide a more amount of contacts.

Figure 3A:
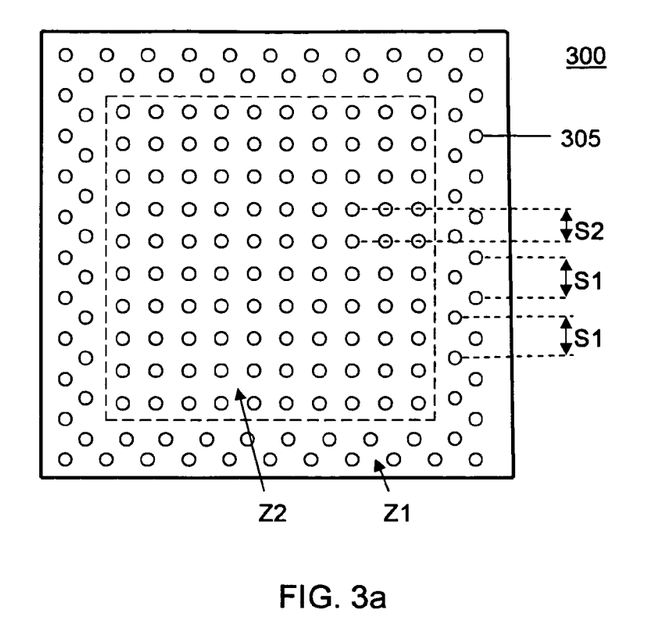
FIG. 3a shows a bottom view of an arrangement of conductive pads on a grid array package according to a second embodiment of the present invention.
Figure 3B:
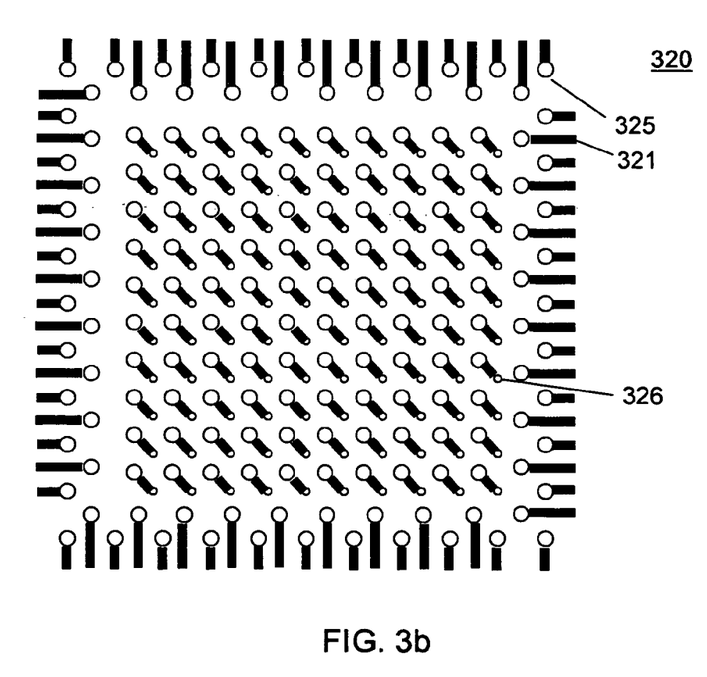
FIG. 3b shows a top view of an arrangement of conductive pads on a circuit board according to the second embodiment of the present invention.

A second embodiment of an arrangement of conductive pads on a grid array package and on a circuit board according to the present invention are shown in FIGS. 3a and 3b. FIG. 3a shows the bottom view of a grid array package 300 and FIG. 3b shows the top view of a circuit board 320 suitable to connect with the package 300. The conductors 305 on a surface of the grid array package 300 are divided into two groups. The first group of conductors 305 is disposed in a peripheral region Z1 of the package 300, and the second group of conductors 305 is disposed in an inner region Z2 of the package 300. The inner region Z2 is surrounded by the peripheral region Z1. The first group of conductors 305 is arranged in a first grid array which the rows and columns are staggered. For example, some conductors 305 in the first group of conductors are arranged in a first row adjacent to right edge of the package 300. Any two adjacent conductors 305 in the first row are separated at the same pitch S1. Some conductors 305 in the first group of conductors are arranged in a second row in the left side of the first row. The conductors in the second row are also separated at the same pitch S1. However, one of the conductors in the second row is disposed in the space between two adjacent conductors in the first row. Thus, the staggered design provides an easy layout for the conductive traces 321 coupled to the conductors in the second row extending out. Except for the staggered fashion on the first grid array, the conductors 305 and the conductive pads 325 on the circuit board 320 are arranged similar to the first embodiment. The conductors 305 and the corresponding conductive pads 325 in the inner region Z2 are regularly disposed in the second pitch S2 to dispose a conductive through hole 326. Because the first pitch S1 is larger than the second pitch S2, the second embodiment also increases the amount of electric contacts between the package 300 and the circuit board 320.

Figure 4A:
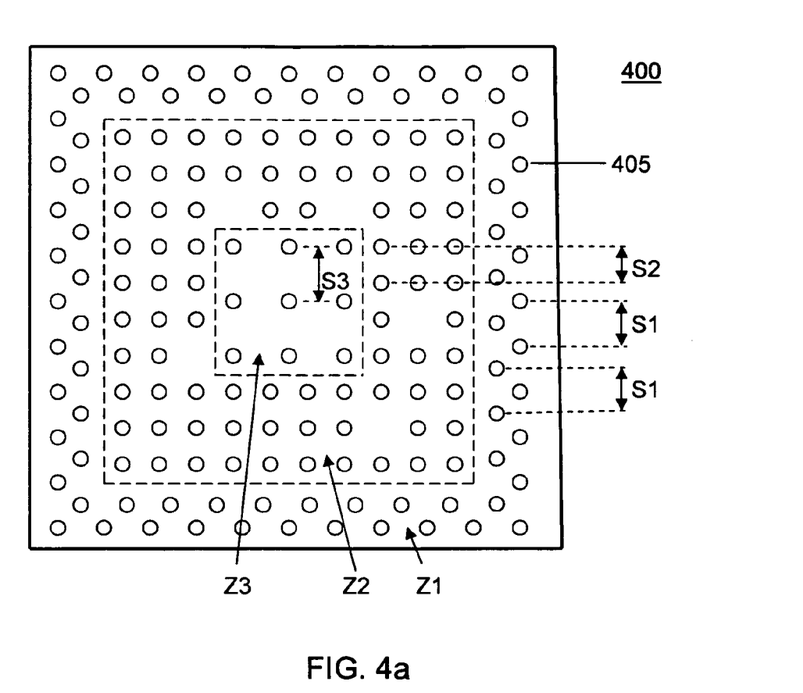
FIG. 4a shows a bottom view of an arrangement of conductive pads on a grid array package according to a third embodiment of the present invention.
Figure 4B:
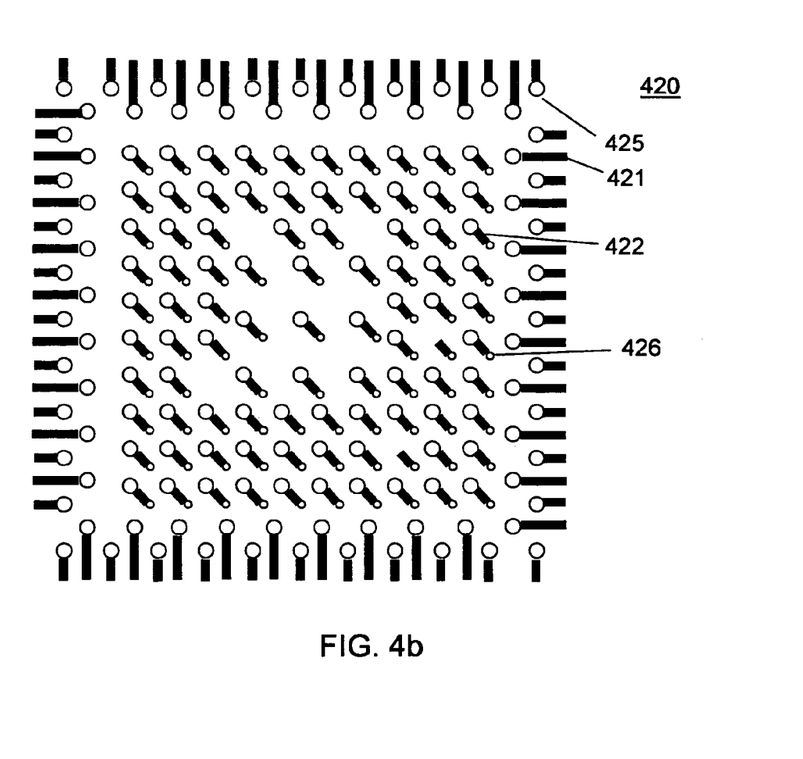
FIG. 4b shows a top view of an arrangement of conductive pads on a circuit board according to the third embodiment of the present invention.

A third embodiment of an arrangement of conductive pads on a grid array package and on a circuit board according to the present invention are shown in FIGS. 4a and 4b. FIG. 4a shows the bottom view of a grid array package 400 and FIG. 4b shows the top view of a circuit board 420 suitable to connect with the package 400. The conductors 405 are divided into three groups. More particularly, the first group of conductors 405 is disposed in a peripheral region Z1, the second group of conductors 405 is disposed in an inner region Z2, and the third group of conductors 405 is disposed in the central region Z3. The central region Z3 is surrounded by the inner region Z2, the inner region Z2 is surrounded by the peripheral region Z1. Most in first group of conductors are disposed in a first pitch S1, and most in second group of conductors are disposed in a second pitch S2. Because of the limitation in the inner layout of the package 400 and the circuit design, some virtual grid may not dispose the conductors 405, as the conductor arrangement in the inner region Z2 shown in FIG. 4b. However, at least eighty percent of the conductors are still regularly disposed in the same pitch.

The conductors of the package 400 are used as signal terminals, power terminals or ground terminals. For a higher electric performance, the ground terminals and the power terminals are normally dispose in a region as closer to the chip as possible, and the signal terminals may be disposed in an outer region. As shown in FIGS. 4a and 4b, the central region Z3 is located under a chip, and one in the third group of conductors 405 is used for the non-signal terminals. In the other words, one in the third group of conductors 405 may be a ground terminal or a power terminal. The amount of power terminals is dependant on the power consumption of the chip, and the amount of the ground terminals is for providing sufficient current return paths. In other word, the third group of conductors disposed in a third pitch S3 which is larger than the second pitch S2 if the non-signal terminals are sufficient for the package 400.

Figure 5A:
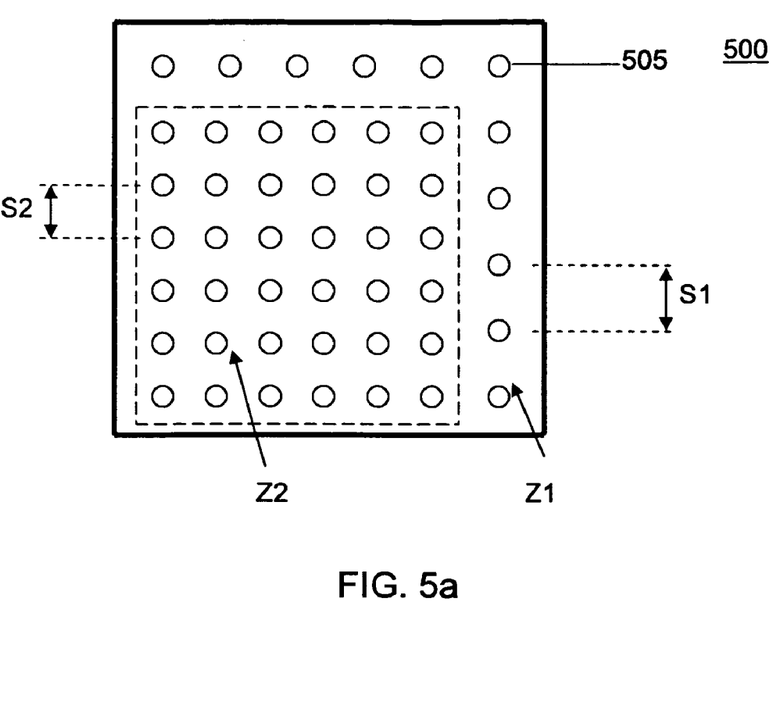
FIG. 5a shows a bottom view of an arrangement of conductive pads on a grid array package according to a fourth embodiment of the present invention.
Figure 5B:
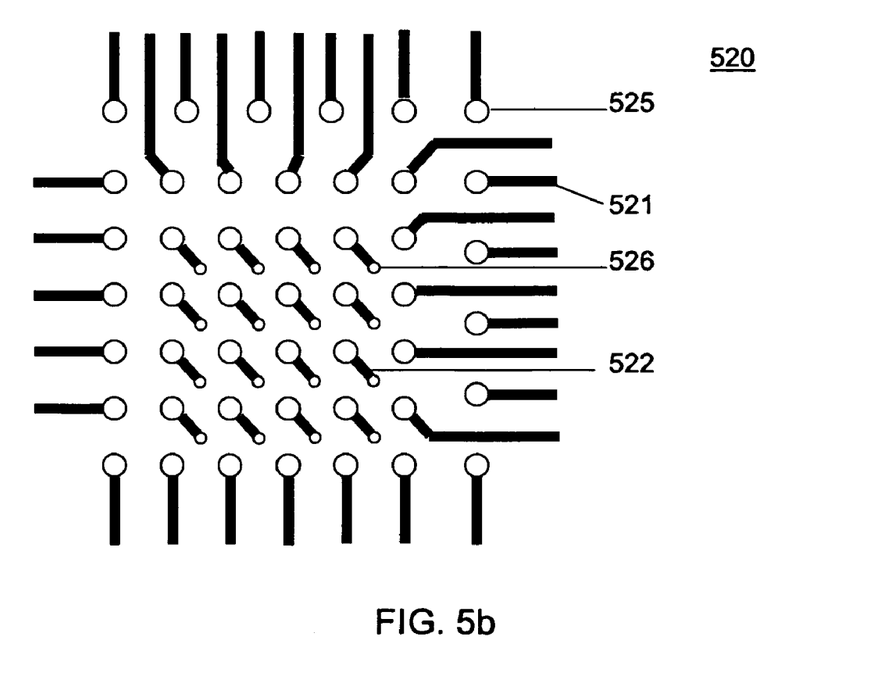
FIG. 5b shows a top view of an arrangement of conductive pads on a circuit board according to the fourth embodiment of the present invention.

A fourth embodiment of an arrangement of conductive pads on a grid array package and on a circuit board according to the present invention are shown in FIGS. 5a and 5b. FIG. 5a shows the bottom view of a grid array package 500 and FIG. 5b shows the top view of a circuit board 520 suitable to connect with the package 500. For the grid array package 500 having a less amount of contacts comparing with the other embodiments, not all the conductors 505 in the peripheral region of the package 500 and the corresponding pads 525 of the circuit board 520 are needed to allow a conductive trace 521 passing through. However, the first group of conductors regularly disposed in a first pitch S1 is located on a first region Z1. The second group of conductors regularly disposed in a second pitch S2 is located on a second region Z2. The first pitch S1 is larger than the second pitch S2 to allow at least one trace 521 passing through. The first region Z1 is adjacent to at least one edge of the package 500. Thus, such the arrangement shown in this embodiment also increases the amount of electrical contacts between the package 500 and the circuit board 520.

In summary, the present invention divides the conductor on the surface of the package and the corresponding conductive pads on the surface of the circuit board into at least two groups. The first group of conductors is disposed in the peripheral region of the package, and most of conductors in the first group are regularly disposed in a first pitch. The second group of conductors is disposed in another region of the package, and most of conductors in the second group are regularly disposed in a second pitch. The fist pitch allows one or two conductive traces on the surface of the circuit board passing through. The second pitch is suitable for one through hole disposed within a space between the conductors. The through hole is a vertical connection structure passing through the circuit board. The present invention may further include a plurality of through hole pads respectively disposed on each through hole as a terminal of the through hole disposed on a conductive layer to connect the conductive trace on the layer. The present invention achieves at least the following advantages:

1. The amount of the contacts of the package is increasing for the same available surface area because a dense contact arrangement in the inner region is provided;

2. The package size can be reduced for the same contacts of the package; and

3. The optimized design is provided as the different technical development. According to the shrinking in the conductive trace on a conductive layer and the shrinking in the through hole, the different pitches in different regions are chosen for the maximum amount of contacts.

Although the invention is illustrated and described herein as embodied in one or more specific examples, it is nevertheless not intended to be limited to the details shown, since various modifications and structural changes may be mode therein without departing from the spirit of the invention and within the scope and claims be constructed broadly and in a manner consistent with the scope of the invention, as set forth in the following claims.

What is claimed is:

1. An arrangement of conductive pads on a grid array package, suitable to electrically connect to a circuit board, comprising:

a plurality of first conductive pads in a peripheral region of the grid array package;

a plurality of second conductive pads in an inner region of the grid array package, wherein most of the first conductive pads are disposed in a first pitch, most of the second conductive pads are disposed in a second pitch, and the first pitch is larger than the second pitch; and a plurality of third conductive pads surrounding by the second conductive pads, wherein most of the third conductive pads are disposed in a third pitch larger than the second pitch.

2. The arrangement of conductive pads on a grid array package of claim 1, wherein the first conductive pads are arranged in a first grid array of rows and columns, and the second conductive pads are arranged in a second grid array of rows and columns.

3. The arrangement of conductive pads on a grid array package of claim 2, wherein the rows and columns of the first grid array are arranged in staggered fashion.

4. The arrangement of conductive pads on a grid array package of claim 2, wherein the rows and columns of the second grid array are arranged in staggered fashion.

5. The arrangement of conductive pads on a grid array package of claim 1, wherein the second conductive pads are surrounding by the first conductive pads.

6. The arrangement of conductive pads on a grid array package of claim 1, wherein the first conductive pads are adjacent to at least an edge of the grid array package.

7. The arrangement of conductive pads on a grid array package of claim 1, wherein at least eighty percent of the first conductive pads are disposed in the first pitch.

8. The arrangement of conductive pads on a grid array package of claim 1, wherein at least eighty percent of the second conductive pads are disposed in the second pitch.

9. The arrangement of conductive pads on a grid array package of claim 1, wherein each of the first conductive pads is respectively coupled to a fourth conductive pad and a trace on the circuit board, the trace extending from the fourth conductive pad toward an edge of the grid array package, and at least one of the traces passing through a space between two adjacent conductive pads of the first conductive pads.

10. The arrangement of conductive pads on a grid array package of claim 1, wherein each of the second conductive pads is respectively coupled to a fifth conductive pad on the circuit board and coupled to a through hole, and at least one of the through holes is disposed in a space between the adjacent fifth conductive pads.

11. An arrangement of conductive pads on a circuit board, suitable to electrically connect to a grid array package, comprising:
a plurality of first conductive pads in a project region of a peripheral region of the grid array package, each of the first conductive pads electrical connected with a first trace on the circuit board extending toward an edge of the grid array package;
a plurality of second conductive pads in a project region of an inner region of the grid array package, each of the second conductive pads electrical connected with a through hole to pass through the circuit board,
wherein most of the first conductive pads are disposed in a first pitch for at least one of the first traces passing through, most of the second conductive pads are disposed in a second pitch to dispose at least one of the though holes coupling to one of the second conductive pads, and the first pitch is larger than the second pitch; and a plurality of third conductive pads surrounding by the second conductive pads, wherein most of the third conductive pads are disposed in a third pitch larger than the second pitch.

12. The arrangement of conductive pads on a circuit board of claim 11, wherein the first conductive pads are arranged in a first grid array of rows and columns, and the second conductive pads are arranged in a second grid array of rows and columns.

13. The arrangement of conductive pads on a circuit board of claim 12, wherein the rows and columns of the first grid array are arranged in staggered fashion.

14. The arrangement of conductive pads on a circuit board of claim 12, wherein the rows and columns of the second grid array are arranged in staggered fashion.

15. The arrangement of conductive pads on a circuit board of claim 11, wherein the second conductive pads are surrounding by the first conductive pads.

16. A grid array package, suitable to electrically connect to a circuit board, comprising:
a substrate having a first surface and a second surface;
a chip disposed on the second surface;
a plurality of conductive pads on the first surface of the substrate, the conductive pads comprises a plurality of first conductive pads arranged in a first grid array of rows and columns are arranged in a first pitch; and a plurality of second conductive pads arranged in a second grid array of rows and columns are arranged in a second pitch, and the first pitch is larger than the second pitch; and a plurality of third conductive pads surrounding by the second conductive pads, the third conductive pads are arranged in a third grid array of rows and columns and arranged in a third pitch larger than the second pitch.

17. The grid array package of claim 16, wherein each of the first conductive pads is respectively coupled to a fourth conductive pad and a trace on the circuit board, the trace extending from the fourth conductive pad toward an edge of the grid array package, and at least one of the traces passing through a space between two adjacent conductive pads of the first conductive pads.

18. The grid array package of claim 16, wherein each of the second conductive pads is respectively coupled to a fifth conductive pad on the circuit board and coupled to a through hole, and at least one of the through holes is disposed in a space between the adjacent fifth conductive pads.

* * * * *